United States Patent [19]
Sung et al.

[11] Patent Number: 5,267,213
[45] Date of Patent: Nov. 30, 1993

[54] BIAS CIRCUITRY FOR CONTENT ADDRESSABLE MEMORY CELLS OF A FLOATING GATE NONVOLATILE MEMORY

[75] Inventors: Chih-Ta Sung, Princeton, N.J.; Jerry G. Jex, Forest Grove, Oreg.; Alan E. Baker, Fair Oaks, Calif.

[73] Assignee: Intel Corporation, Santa Clara, Calif.

[21] Appl. No.: 861,093

[22] Filed: Mar. 31, 1992

[51] Int. Cl.⁵ .............................................. G11C 13/00
[52] U.S. Cl. .................................. 365/226; 365/900; 365/203
[58] Field of Search ............... 365/203, 154, 226, 182, 365/900

[56] References Cited
U.S. PATENT DOCUMENTS
5,047,985 9/1991 Mayaji ................................ 365/203

Primary Examiner—Terrell W. Fears
Attorney, Agent, or Firm—Blakely, Sokoloff, Taylor & Zafman

[57] ABSTRACT

A low power bias voltage generation circuitry for content addressable memory cells for a nonvolatile memory is described. The bias circuitry is comprised of a source follower pair and two cascaded high impedance voltage dividers. The source follower pair acts as a positive feedback loop coupling between the two high impedance voltage dividers for relatively quickly charging and settling the output node to a predetermined voltage level. The first high impedance voltage divider can relatively quickly provide an input signal to trigger the small-input-load second high impedance voltage divider. The second high impedance voltage divider comprised of two high impedance diode stacks allows most current drawing from the power supply to drive a relatively large output loading during switching. Both first and second high impedance voltage dividers help keep the DC current of the circuit to a relatively low level which helps to reduce the total power consumption of the circuit.

24 Claims, 6 Drawing Sheets

FIG_2

FIG._4

ABLE2 to conduct a high voltage supply of approximately 12 volts to the drain of transistors 21 and 22, respectively, for programming of transistors 21 and 22. Initially, both transistors 21 and 22 are in the erased state (i.e., conducting). To program CAM cell 20 to a logical "zero" state, transistor 21 is typically programmed to become non-conducting. Similarly, to program CAM cell 20 to a logical "one" state, transistor 22 is typically programmed to become non-conducting.

CAM cell 20 also includes transistors 28 and 29 that are coupled to transistors 21 and 22, respectively. Two P-channel transistors 23 and 24 couple the power supply to the drains of transistors 28 and 29, respectively. Transistors 23 and 24 are also referred to as pull-up transistors of CAM cell 20. Once programmed, the

BIAS CIRCUITRY FOR CONTENT ADDRESSABLE MEMORY CELLS OF A FLOATING GATE NONVOLATILE MEMORY

FIELD OF THE INVENTION

The present invention pertains to the field of computer memories. More particularly, this invention relates to a bias circuitry for content addressable memory ("CAM") cells of floating gate nonvolatile memories, wherein the circuitry minimizes power consumption and minimizes the time to recover from power down.

BACKGROUND OF THE INVENTION

Metal-oxide-semiconductor ("MOS") electrically programmable read-only memories ("EPROMs") frequently use memory cells that have electrically isolated gates which are referred to as floating gates. Information is stored in the memory cells in the form of charge on the floating gates.

One type of prior EPROM is the flash erasable and electrically programmable read-only memory ("flash EPROM"). The flash EPROM can be programmed by a user, and once programmed, the flash EPROM retains its data until erased. Once programmed, the contents of the flash EPROM can be erased by electrical erasure. The flash EPROM may then be reprogrammed with new codes or data.

One type of prior flash EPROM typically contains content addressable memory ("CAM") cells in addition to a main memory array. Typically, the number of the CAM cells are in the range of a few hundred. The CAM cells typically comprise flash EPROM cells. The CAM cells are used to perform certain configuration and management functions. The CAM cells are programmed before the memory device reaches the end user as a final product. The CAM cells can be programmed to configure the memory device with respect to the device operation (for example, latched inputs, CEBTTL active high, OEBTTL active high, etc.). The CAM cells can also be used to activate (or deactivate) redundancy cells with respect to the main memory array. The redundancy cells are used in place of defective cells of the main memory array.

The CAM cells are typically biased by a bias circuit. FIG. 1 illustrates in circuit diagram form one prior art bias circuit 10 for the prior CAM cells. In FIG. 1, only one prior CAM cell 20 is shown to couple to bias circuit 10 for illustration purpose. CAM cell 20 is formed by two N type flash EPROM transistors 21 and 22. Transistors 21 and 22 each has a floating gate residing underneath the control gate of the transistor. Transistors 25 and 27 are controlled by signals ENABLE1 and ENAconducting one of transistors 21 and 22 of CAM cell 20 is then biased by its respective one of transistors 28 and 29. For example, if CAM cell 20 is programmed to logical "one" state, transistor 21 is conducting and transistor 22 is not conducting. In this case, transistor 28 couples the drain voltage to transistor 21. The functions of transistors 28 and 29 typically include (1) isolating the drains of transistors 23 and 24 from CAM cell transistors 21 and 22, respectively; (2) preventing latch-up or push-back of the CAM cell during programming operation; and (3) providing a constant drain voltage of approximately 1 volt to transistors 21 and 22 during read operations of the CAM cell to avoid any read disturbance problems. If the drain of transistor 21 or 22 is tied to a voltage higher than 1.5 volts for long time, disturbance will occur.

Both transistors 28 and 29 are coupled to bias circuit 10 to receive a BIAS voltage. The BIAS voltage controls transistors 28 and 29 to generate and couple the constant drain voltage to transistors 21 and 22. Bias circuit 10 includes P-channel transistors 11 and 12 and N-channel transistors 13 and 14. P-channel transistor 11 is coupled to the power supply and receives a CE2 control signal to turn on and off the circuit. P-channel transistor 12 acts as a voltage divider and minimizes power noise of the power supply. N-channel transistors 13 and 14 are stacked diodes typically employed to set the voltage level of the BIAS voltage at node 10a at a constant level of approximately 2 volts. Bias circuit 10 supplies the BIAS voltage to CAM cell 20 at node 10a. The constant BIAS voltage applied at the gates of transistors 28 and 29 causes transistors 28 and 29 to supply the constant drain voltage to transistors 21 and 22.

Given that the BIAS voltage applied to transistors 28 and 29 is constant and given that the drain voltage of transistors 21 and 22 (if conducting) depends on the BIAS voltage applied at the gates of transistors 28 and 29 (i.e., the drain voltage is equal to the BIAS voltage minus the threshold voltage of transistors 28 and 29, respectively), the drain voltage of transistors 21 and 22, in this case, is typically maintained at a constant 1 volt voltage level, thus eliminating read disturbance problem and problems due to power supply variations of the power supply.

Disadvantages are, however, associated with such prior art bias circuit. One disadvantage associated is that the circuit consumes a relatively large amount of power. This is due to the fact that transistors 13 and 14 with their intrinsic impedance of stacked diodes, which function as voltage dividers, are typically low impedance transistors. Transistors 13 and 14 typically employ relatively wide width N-channel transistors in the bias circuit to set the voltage level at node 10a to 2 volts. The low impedance of transistors 13 and 14, however, causes more current to flow through these transistors to ground, thus resulting in a relatively large power consumption of the circuit. Replacing transistors 13 and 14 with high impedance transistors simply either causes the voltage level at output node 10a to an undesirable level or slows the recovery of the circuit from power down.

Another disadvantage associated is that the circuit has a relatively longer recovery time to settle the voltage level at node 10a to the steady voltage level of 2 volts from the OFF state when the circuit is coupled to a plurality of CAM cells. The plurality of CAM cells typically represent a relatively large load to the circuit.

When the bias circuit is turned on by the low CE2 control signal, a relatively larger amount of current is required for the CAM cells because of the relatively large load. This causes the circuit to slowly raise the voltage level at node 10a to 2 volts, which results in a relatively slow recovery of the circuit from the OFF state.

Another disadvantage associated is that a precharging time for transistor 12 is typically required before the voltage level at node 10a can rise when the circuit is turned on. Whenever transistor 11 is first turned on by the CE2 signal, it couples the power supply to transistor 12. Transistor 12 is then charged by the power supply until it is conducting. The precharging time also contributes to the slow recovery of the circuit from the OFF state. The precharging time is typically in the range of approximately 34 nanoseconds ("ns") because of the large loading resulted from the large number of the CAM cells.

SUMMARY AND OBJECTS OF THE INVENTION

One object of the present invention is to provide bias circuitry for CAM cells of a memory, wherein the bias circuitry that minimizes recovery time from the power-down, which in turn maximizes performance.

Another object of the present invention is to provide bias circuitry for the CAM cells, wherein the bias circuitry minimizes power consumption.

A further object of the present invention is to provide bias circuitry for the CAM cells, wherein the voltage provided by the bias circuitry is independent of temperature variations, power supply variations, and process skews.

A nonvolatile memory is described which comprises a memory array and a configuration cell for configuring the memory with respect to memory device operation. The configuration cell is coupled to various internal circuits of the memory. A bias circuit is coupled to the configuration cell for providing a drain voltage to the configuration cell. The bias circuit comprises a source follower coupled to a power supply and an output node for charging and settling the output node to a predetermined voltage level when the circuit is powered on. The source follower acts as a positive feedback loop to quickly charge and settle the output node to the predetermined voltage level. The output node provides the drain voltage to the configuration cell. The source follower has a first source line and a second source line. The first source line is coupled to the output node. The second source line is coupled to ground. A first high impedance voltage divider is coupled to the first source line and the ground for setting the voltage level of the output node at the predetermined voltage level and for limiting current flow from the first source line toward the ground such that power consumption of the bias circuit is substantially reduced.

A circuit for providing drain voltage to a configuration cell of a non-volatile memory is also described. A first high impedance P-channel transistor has a source coupled to a power supply, and a gate coupled to ground. The first P-channel transistor functions as a voltage divider and to reduce the power supply noise to the circuit. A second P-channel transistor has a source coupled to a drain of the first P-channel transistor, and a gate coupled to a control signal. The control signal controls on and off of the second P-channel transistor which in turn controls on and off of the circuit. A first N-channel transistor has a drain coupled to a drain of the second P-channel transistor, and a gate coupled to an output node of the circuit. A first high impedance voltage divider includes a second N-channel transistor having a drain and a gate coupled to a source of the first N-channel transistor, and a source coupled to the ground. The second N-channel transistor has a high impedance. A third N-channel transistor has a drain coupled to the power supply, a gate coupled to the drain of the second P-channel transistor, and a source coupled to the output node. The first N-channel transistor and the third N-channel transistor form a positive feedback loop for charging and settling the output node to a predetermined voltage level. The output node provides the drain voltage. A second high impedance voltage divider is coupled between the output node and the ground. The second high impedance voltage divider includes a fourth N-channel transistor and a fifth N-channel transistor. The fourth N-channel transistor has a drain and a gate coupled to the output node. The fifth N-channel transistor has a drain and a gate coupled to a source of the fourth N-channel transistor, and a source coupled to the ground. The first P-channel transistor is constantly charged by the power supply such that no precharging time is needed for the circuit when the control signal causes the second P-channel transistor to conduct. When the control signal causes the second P-channel transistor to conduct, the positive feedback loop quickly charges and settles the output node to the predetermined voltage level. The first and the second high impedance voltage dividers limit DC current flowing to the ground and allow most of the current from the power supply to drive the output node which also helps to increase the settling speed.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 2:
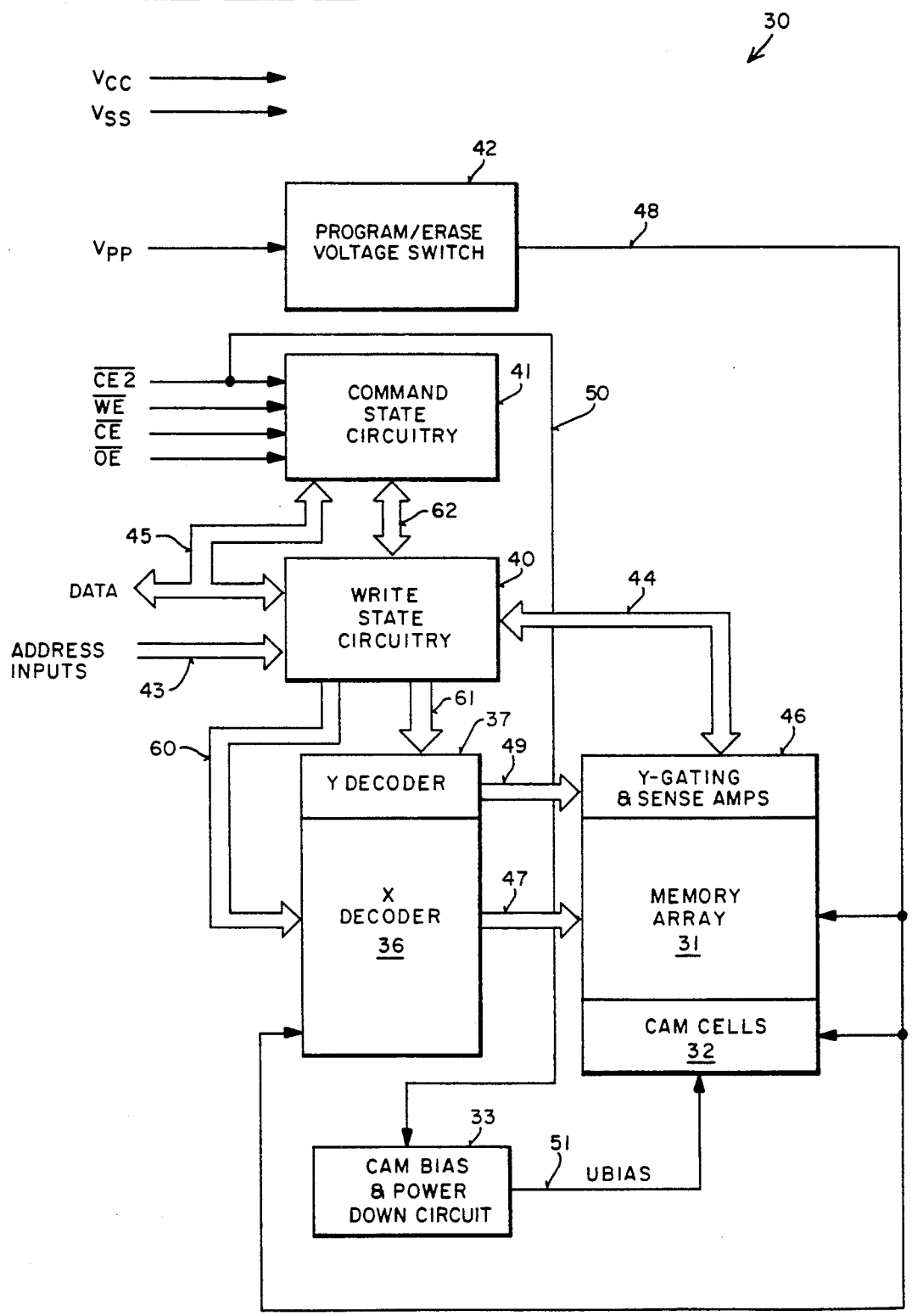
FIG. 2 is a block diagram of the layout of a flash EPROM, including CAM cells and a CAM bias and power down control circuit.

FIG. 2 illustrates in block diagram form the circuitry of a flash EPROM 30, which implements a preferred embodiment of the present invention. Flash EPROM 30 includes a memory array 31, which is made up of memory cells that store data at addresses. In one embodiment, memory array 31 can store 4 Mbits ("megabits") of data. In another embodiment, memory array 31 can store 8 Mbits ("megabits") of data. In alternative embodiments, memory array 31 can be smaller than 4 Mbits or larger than 8 Mbits.

In one embodiment, memory array 31 is organized into bit line blocks by arranging bit lines into groups. In another embodiment, memory array 31 is organized into word line blocks by arranging word lines into groups.

As described in more detail below, flash EPROM 30 includes low power bias voltage generation circuitry for content addressable memory cells. The bias circuitry is comprised of a source follower pair and two cascaded high impedance voltage dividers. The source follower pair acts as a positive feedback loop coupling between the two high impedance voltage dividers for relatively quickly charging and settling the output node to a predetermined voltage level. The first high impedance voltage divider can relatively quickly provide an input signal to trigger the small-input-load second high impedance voltage divider. The second high impedance voltage divider comprised of two high impedance diode stacks allows most current drawing from the power supply to drive a relatively large output loading during switching. Both first and second high impedance voltage dividers help keep the DC current of the circuit to a relatively low level, which helps to reduce the total power consumption of the circuit.

In a preferred embodiment, all the circuitry of flash EPROM 30 shown in FIG. 2 is on a single substrate. In a preferred embodiment, flash EPROM 30 employs CMOS circuitry.

Flash EPROM 30 includes an X decoder 36 and a Y decoder 37. X decoder 36 is the row decoder for memory array 31 and Y decoder 37 is the column decoder for memory array 31. X decoder 36 is coupled to word lines of memory array 31. X decoder 36 receives X addresses from address buses 43 and 60. X decoder 36 selects one word line in accordance with each of the X addresses provided via bus 43.

Y decoder 37 is coupled via Y gating 46 to bit lines of memory array 31. Y decoder 37 receives its Y addresses from address buses 43 and 61. In one of read and program operations, Y decoder 43 selects one byte of bit lines (i.e., 8 bit lines) for each of the Y addresses applied. Y gating 46 also includes sense amplifiers.

For the embodiments in which memory array 31 is organized into blocks, each block includes a block common source line. A block decoder (not shown) is required to decode the blocked memory array 31, respectively, to undergo a block erase operation. A block address is applied to the block decoder of memory array 31. The block decoder then couples a high erase voltage Vpp to the selected common source line of the selected block. In this way, only the source regions of the memory cells of the selected block are coupled to the high erase voltage Vpp during the block erasure operation. The source regions of the memory cells in the unselected blocks remain uncoupled to the high erase voltage Vpp, thereby achieving the blocked erasure in memory array 31.

The block decoder for the blocked memory array 31 is coupled to the common source lines for all the blocks within memory array 31. The block decoder receives its X or Y address as its block address. The block decoder then selects one block by selecting the common source line associated with the selected block for any given block address.

Given that each of the blocks in memory array 31 has only one common source line coupled to its associated block decoder, only a subset of either the X addresses or the Y addresses is required to determine which block has been selected and conversely which blocks are not selected. Thus, the block decoder may be an intermediate decoding stage of an X or Y decoder. It is also true that the block decoder may be a separate decoder.

Flash EPROM 30 also includes an on-chip write state circuitry 40 and an on-chip command state circuitry 41. Write state circuitry 40 is coupled to data bus 45 and address bus 43. Write state circuitry 40 sequences flash EPROM 30 through multi-step sequences to program or erase memory contents as desired with only an initiating command from an external microprocessor (not shown). The command is applied by the external microprocessor to command state circuitry 41 via data bus 45. Command state circuitry 41 decodes the command and if it represents an erase, program or status register reset command, generates the appropriate control signals to write state circuitry 40.

Flash EPROM 30 also includes a program/erase voltage switch 42. Program/erase voltage switch 42 passes the program voltage Vpp onto X decoder 36 and a program voltage Vp onto Y decoder 37 via line 48. The program voltage Vp is the lowered program voltage Vpp. In one embodiment, the program voltage Vp is approximately +7 volts. Program/erase voltage switch 42 also passes the erase voltage Vpp onto memory array 31 via line 48.

Vpp is the erase/program power supply voltage for flash EPROM 30. Vpp is coupled to program/erase voltage switch 42 of flash EPROM 30. Vcc is the device power supply for flash EPROM 30 and Vss is ground. In one embodiment, Vpp is approximately 12.0 volts and Vcc is approximately 5.0 volts.

In the absence of the high Vpp voltage on the Vpp input pin to flash EPROM 30, the device acts as a read-only memory. The data stored at an address supplied via address bus 43 and decoded by X and Y decoder 36 and 37 is read from memory array 31 and made available through (1) sense amplifier 46 via buses 44 and 45 and (2) via state control circuitry 40 to the external microprocessor.

Device operations of flash EPROM 30, such as read, program, and erase, etc., are selected by writing specific commands into command state circuitry 41 via data bus 45. The commands may include erase set-up command, erase confirm command, program set-up command, program command, and read command. While Vpp is high for erasure and programming, memory array 31 can be accessed via the read command as well.

The program and erase operations are regulated by write state circuitry 40 internally, including program pulse repetition where required and internal verification and margin of data. This is also referred to as internal write automation.

Write state circuitry 40 includes a status register (not shown). The external microprocessor can access the status register to read the status data stored in the status register. The status data helps the external microprocessor to determine when the erase or program operation is completed, and whether the operation is completed successfully. The status register may be read at any time.

Commands to program or erase memory array 31, are applied via data bus 45. Command state circuitry 41 decodes the commands and provides the control signals to write state circuitry 40 via bus 42.

Write state circuitry 40 latches in the necessary address and data needed to complete erase and program operations from address bus 43 and data bus 45. The address and data latch operations of write state circuitry 40 is controlled by the control signals from the command state circuitry 41 via bus 62.

Write state circuitry 40 controls the device operations of flash EPROM 30. It controls the erase/program operation by controlling the application of the high program/erase voltage Vpp to memory array 31. Write state circuitry 40 interfaces with memory array 31 via line 60, line 61, and bus 44. Bus 44 is bidirectional. Write state circuitry 40 applies addresses to memory array 31 via lines 60 and 61. Write state circuitry 40 applies data to be programmed to memory array 31 via bus 44. Write state circuitry 40 receives data read from memory array 31 and sensed by sense amplifier 46 also via bus 44.

Flash EPROM 30 includes three control signals coupled to command state circuitry 41—namely, chip enable $\overline{CE}$, output enable $\overline{OE}$, and write enable $\overline{WE}$. Chip enable input $\overline{CE}$ is the power control and is used for device selection of flash EPROM 30. The output enable input $\overline{OE}$ is the output control from flash EPROM 30 and is used to gate data from the output pins from flash EPROM 30, dependent on device selection. Both of the control functions $\overline{CE}$ and $\overline{OE}$ must be logically active to obtain data at the outputs of flash EPROM 30. When the enable pin $\overline{CE}$ is high at Vcc voltage, flash EPROM 30 enters a standby mode. In the standby mode, power consumption by flash EPROM 30 is reduced.

The write enable signal $\overline{WE}$ allows writes to command state circuitry 41 while chip enable input $\overline{CE}$ is active low. Write enable signal $\overline{WE}$ is active low. Addresses and data are latched on the rising edge of the write enable $\overline{WE}$ signal. Standard microprocessor timings are used.

Flash EPROM 30 includes a power down mode. When flash EPROM 30 enters the power down mode, all circuitry of flash EPROM 30 are powered off and the power consumption of flash EPROM 30 is substantially less than that of flash EPROM 30 in the standby mode. When flash EPROM 30 enters the power down mode, memory array 31 is deselected and power supply to all circuitry in flash EPROM 30 is switched off. Recovery from the power down mode requires a certain period of time which depends on switching speed of the circuits of flash EPROM 30.

Flash EPROM 30 includes a $\overline{CE2}$ pin. The $\overline{CE2}$ pin is coupled to command state circuitry 41. The $\overline{CE2}$ pin supplies a $\overline{CE2}$ control signal to command state circuitry 41. The $\overline{CE2}$ control signal is an active low power down control signal. A logically low $\overline{CE2}$ control signal causes flash EPROM 30 to enter the power down mode. As described above, when flash EPROM 30 enters the power down mode, all circuits of flash EPROM 10 are powered off. When the $\overline{CE2}$ control signal supplied at the $\overline{CE2}$ pin raises to the Vcc voltage (i.e., logical high), flash EPROM 30 returns to its normal operational modes.

In alternative embodiments, the $\overline{CE2}$ control signal applied at the $\overline{CE2}$ pin of flash EPROM 30 may include a Vpp voltage signal (i.e., high voltage signal).

Flash EPROM 30 also includes CAM cells 32. CAM cells 32 are located peripherally to memory array 31. CAM cells 32 are also referred to as configuration cells 32. CAM cells 32 are formed from flash EPROM-type cells that can be electrically programmable and erasable. CAM cells 32 are used to perform configuration and managment functions for flash EPROM 30. CAM cells 32 can be programmed to configure the operation of flash EPROM 30. CAM cells 32 are also used to activate (or deactivate) redundancy cells (not shown) located within memory array 31. The redundancy cells are used to replace defective cells of memory array 31. The redundancy cells are used in place of defective cells of memory array 31. CAM cells 32 are initially erased. Once any cell of CAM cells 32 is programmed to a logical zero or logical one state, that cell remains at that state until erased and reprogrammed.

Flash EPROM 30 also includes a CAM bias and power down control circuit 33. CAM bias and power down control circuit 33 is coupled to CAM cells 32 via line 51. CAM bias and power down control circuit 33 also receives the $\overline{CE2}$ control signal supplied on the $\overline{CE2}$ pin via line 50. CAM bias and power down control circuit 33 provide a constant analog bias voltage UBIAS to CAM cells 32 via line 51. In a preferred embodiment, the UBIAS voltage is approximately 2 volts.

The $\overline{CE2}$ control signal coupled to CAM bias and power down control circuit 33 via line 50 controls on and off of circuit 33. When the $\overline{CE2}$ control signal is at the logical high level, CAM bias and power down control circuit 33 is turned on by the $\overline{CE2}$ control signal and provides the constant UBIAS voltage to CAM cells 32. The erased ones of CAM cells 32 are properly biased and have current flows through them. When the $\overline{CE2}$ control signal is at the logical low level, CAM bias and power down control circuit 33 is turned off. The output of CAM bias and power down control circuit 33 is zero volts and CAM cells 32 are all turned off. As described above, flash EPROM 30 enters the power down mode when the $\overline{CE2}$ control signal applied at the $\overline{CE2}$ pin is logical low. Therefore, the logical low $\overline{CE2}$ control signal causes CAM bias and power down control circuit 33 to turn off CAM cells 32 in the power down mode of flash EPROM 30.

As shown in FIG. 2, program/erase voltage switch 42 also passes the program/erase voltage Vpp onto CAM cells 32 via line 48. In one embodiment, CAM cells 32 can be programmed and erased via write state circuitry 40, and X and Y decoders 16 and 17.

Figure 3:
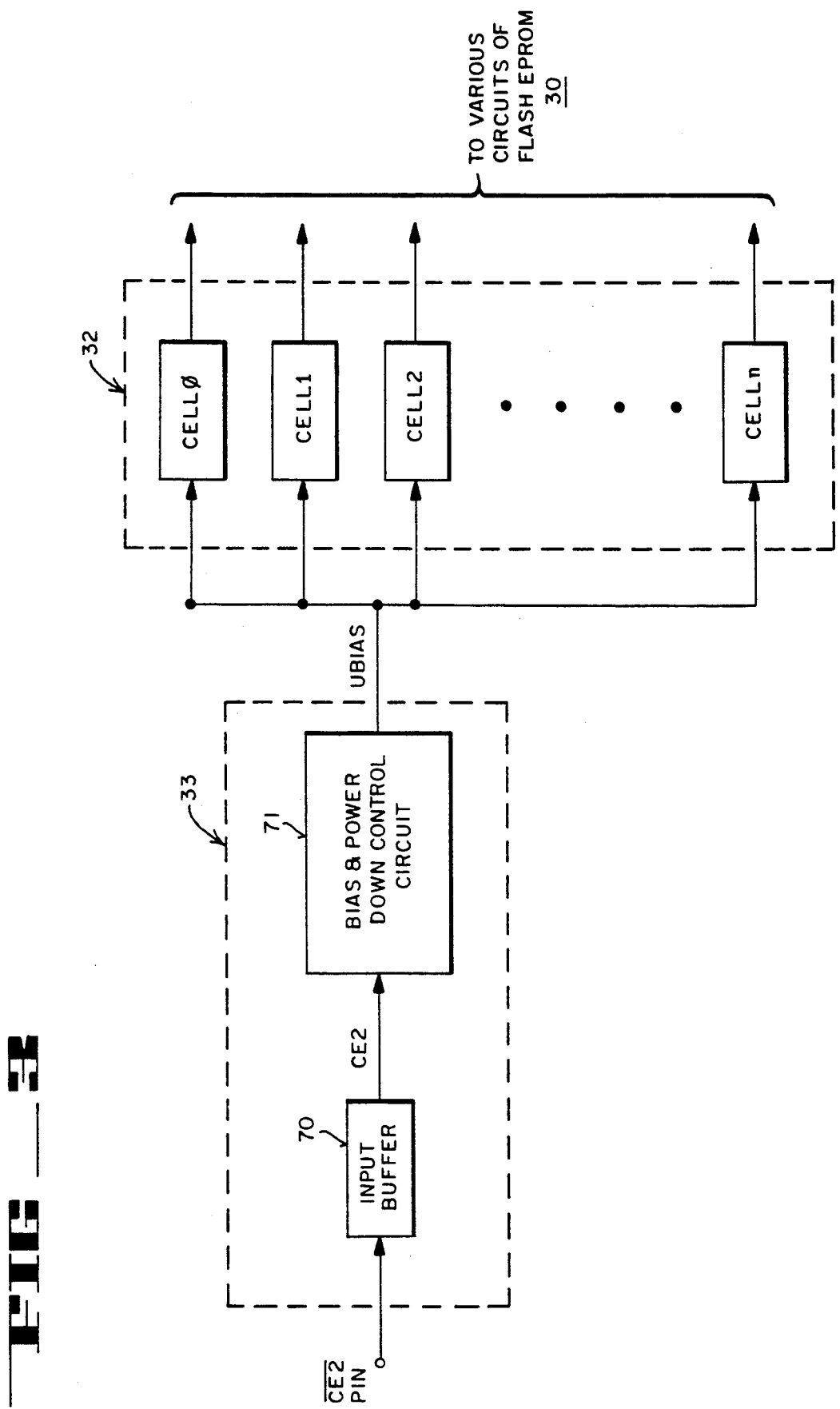
FIG. 3 is a block diagram of circuitry that includes a plurality of CAM cells and the CAM bias and power down control circuit of the flash EPROM of FIG. 2.

FIG. 3 illustrates a plurality of CAM cells CELL0 through CELLn of CAM cells 32 coupled to CAM bias and power down control circuit 33. As can be seen from FIG. 3, CAM bias and power down control circuit 33 includes input buffer 70 and bias and power down control circuit 71. Bias and power down control circuit 71 is also referred to as bias and control circuit 71. Input buffer 70 is located between the $\overline{CE2}$ pin and bias and control circuit 71. Input buffer 70 receives from the $\overline{CE2}$ pin the $\overline{CE2}$ control signal. Input buffer 70 acts as an inverter which inverts the $\overline{CE2}$ control signal applied. Input buffer 70 applies a CE2 signal to bias and control circuit 71. Input buffer 70 also prevents any high voltage applied at the $\overline{CE2}$ pin from being coupled to bias and control circuit 71. Bias and control circuit 71 applies the UBIAS voltage to each of CAM cells 32. The outputs of CAM cells 32 are connected to various internal circuits of flash EPROM 30 so that CAM cells 32 can provide configuration and activation of redundancy functions.

As described above, the UBIAS voltage is the constant two volt analog bias voltage for CAM cells 32.

When the $\overline{CE2}$ control signal applied at the $\overline{CE2}$ pin is logically high, input buffer 70 applies a logical low CE2 signal to bias and control circuit 71. Bias and control circuit 71 is then powered on by the low CE2 signal to provide the UBIAS voltage to each of CAM cell 32. When the $\overline{CE2}$ control signal is logically low, input buffer 70 applies a logical high CE2 signal to bias and control circuit 71. Bias and control circuit 71 is then switched off by the high CE2 signal and the UBIAS voltage applied to CAM cells 32 from bias and control circuit 71 becomes a zero volt signal. In this case, CAM cells 32 are all powered off by the zero volt signal and no current flowing through CAM cells 32. Flash EPROM 30 enters the power down mode. When the $\overline{CE2}$ control signal becomes logically high, flash EPROM 30 is returned from the power down mode. Bias and control circuit 71 is then switched on by the low CE2 signal to generate the UBIAS bias voltage to each of CAM cells 32.

Figure 4:
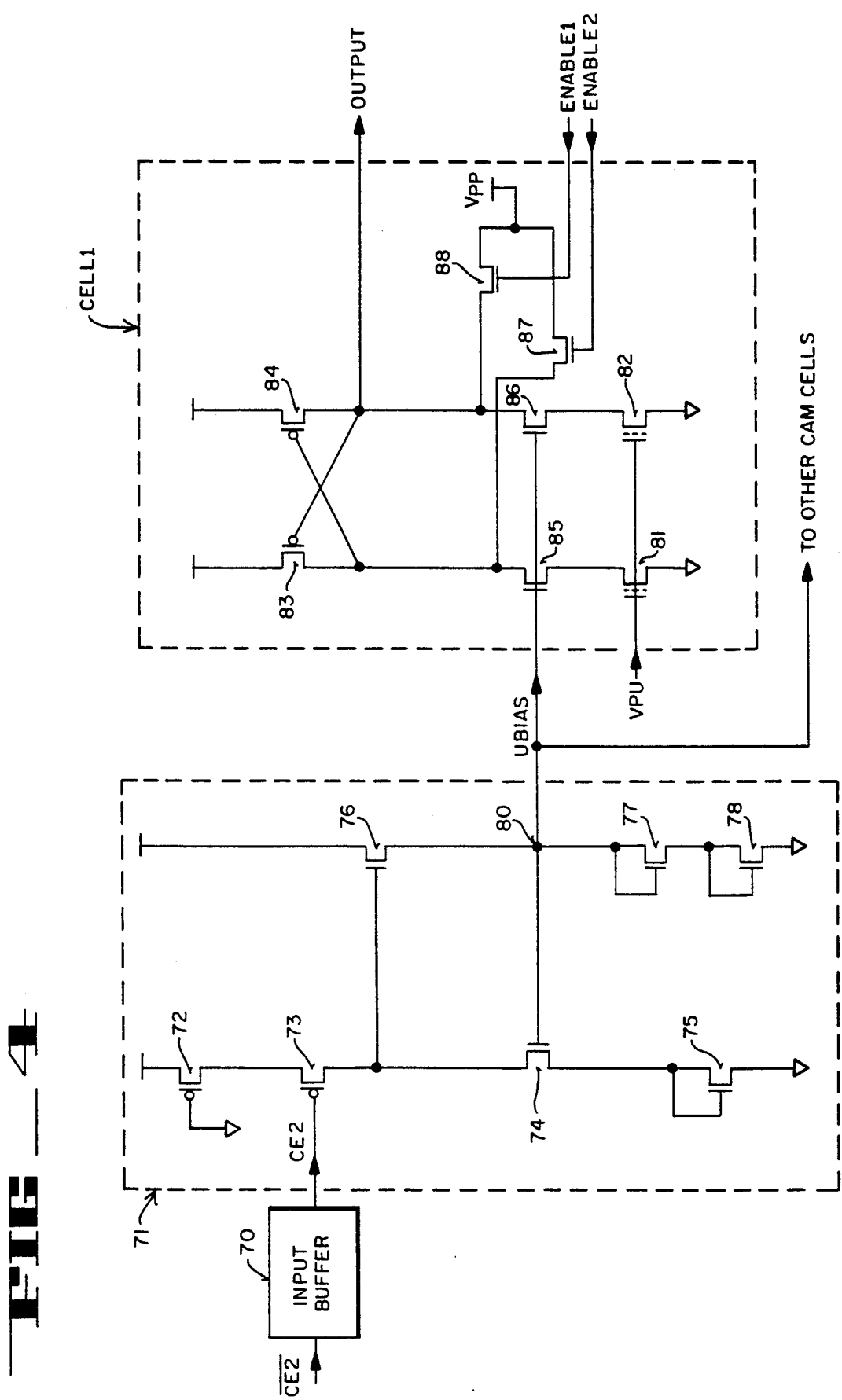
FIG. 4 is a circuitry diagram of the CAM bias and power down control circuit coupled to one CAM cell.

In order to maintain a fast recovery time from the power down mode for CAM cells 32, bias and control circuit 71 needs to quickly generate the constant 2 volt UBIAS voltage to CAM cells 32. FIG. 4 illustrates the circuit of bias and control circuit 71 that accomplishes the goal. In addition, bias and control circuit 71 consumes substantially less power than that of the prior art bias circuit 10 of FIG. 1. The circuitry of bias and control circuit 71 will be described in detail below, in conjunction with FIG. 4.

FIG. 4 illustrates the circuitry of bias and control circuit 71 of FIG. 3. FIG. 4 also illustrates the circuitry of one cell CELL1 of CAM cells 32 to which bias and control circuit 71 is coupled. In FIG. 4, bias and control circuit 71 includes a P-channel transistor 72 having a source coupled to the Vcc power supply, a gate coupled to ground, and a drain coupled to the source of another P-channel transistor 73. Transistor 72 is set to be constantly conducting. The function of transistor 72 is to lower the voltage of the power supply to the circuit and to maximize supply noise immunity for the circuit. Transistor 73 has its gate coupled to receive the CE2 signal. Transistor 73 is controlled by the CE2 signal to switch on and off. The drain of transistor 73 is then coupled to the drain of an N-channel transistor 74.

Input buffer 70 applies the CE2 signal to the gate of transistor 73. As described above, input buffer 70 includes an inverter that inverts the $\overline{CE2}$ control signal to the CE2 signal.

Transistors 74 and 75 are N-channel transistors. Transistor 74 has its drain coupled to the drain of transistor 73, and its source coupled to the drain of transistor 75. Transistor 75 has its gate coupled to its drain, and its source coupled to ground. Transistor 75 is set to be constantly conducting. Transistor 75 is a high impedance transistor. The function of transistor 75 is to set the gate voltage of transistor 76 at approximately 3 volts and to limit DC current flow of the circuit towards ground, thereby substantially deducing the power consumption of the circuit. As can be seen from FIG. 4, transistors 72-75 form one circuit branch of bias and control circuit 71.

Bias and control circuit 71 includes N-channel transistors 76-78 which form another circuit branch of the circuit. Transistor 76 has its drain coupled to the Vcc power supply, its gate coupled to the drain of transistor 73, and its source coupled to an output node 80 of the circuit. Output node applies the UBIAS voltage to CAM cells 32. As can be seen from FIG. 4, the UBIAS voltage is coupled to the gates of transistors 85 and 86 of CAM cell CELL1. Transistor 74 has its gate coupled to output node 80. Transistors 74 and 76 form a source follower. The function of the source follower formed by transistors 74 and 76 is to provide a positive feedback loop for output node 80 which quickly charges and settles the voltage level at output node 80 to 2 volts when bias and control circuit 71 is turned on by the low CE2 signal at the gate of transistor 73.

Transistors 77 and 78 are also coupled to be constantly conducting. Transistors 77 and 78 each is a high impedance transistor. Transistor 77 has its drain and gate coupled to output node 80, and its source to the drain and gate of transistor 78. Transistor 78 has its source coupled to ground. The function of transistors 77-78 is to set the voltage level of the output node at approximately 2 volts and to limit the current flow of the circuit towards ground, thereby substantially reducing the power consumption of the circuit.

As described above, when the $\overline{CE2}$ control signal is at logical low, the CE2 signal causes transistor 73 to cease conduction, which in turn turns off bias and control circuit 71. The UBIAS voltage at output node 80 is zero volts. CAM cells 32 are all turned off and the device is in the power down mode.

When the $\overline{CE2}$ control signal changes to the logical high, the inverted CE2 signal turns on transistor 73 which couples a lowered power supply voltage to the gate of the transistor 76 and to the drain of transistor 74. Because transistor 72 is coupled to the power supply first, no precharging time for transistor 72 is therefore required when transistor 73 is switched on by the CE2 signal. This reduces the total recovery time for the circuit significantly. For one embodiment, approximately 34 nanoseconds of the recovery time is saved. This is based on the 0.8 μm CMOS technology.

As soon as transistor 73 is on, it couples the lowered power supply voltage to the gate of transistor 76 and to the drain of transistor 74. Transistor 76 is therefore switched on which in turn charges output node 80. When the voltage level at output node 80 rises, transistor 74 is also turned on which in turn draws more current from power supply. This causes more current to flow to the gate of transistor 76 which then causes transistor 76 to provide more current to charge output node 80. This in turn further raises the voltage level of output node 80 which causes transistor 74 to draw even more current from the power supply. A positive feedback loop is thus formed by transistors 74 and 76 to quickly charge output node 80. The positive feedback loop ends when both transistors 74 and 76 reach their saturated states and settle the voltage level of output node 80 at 2 volts.

Figure 6:
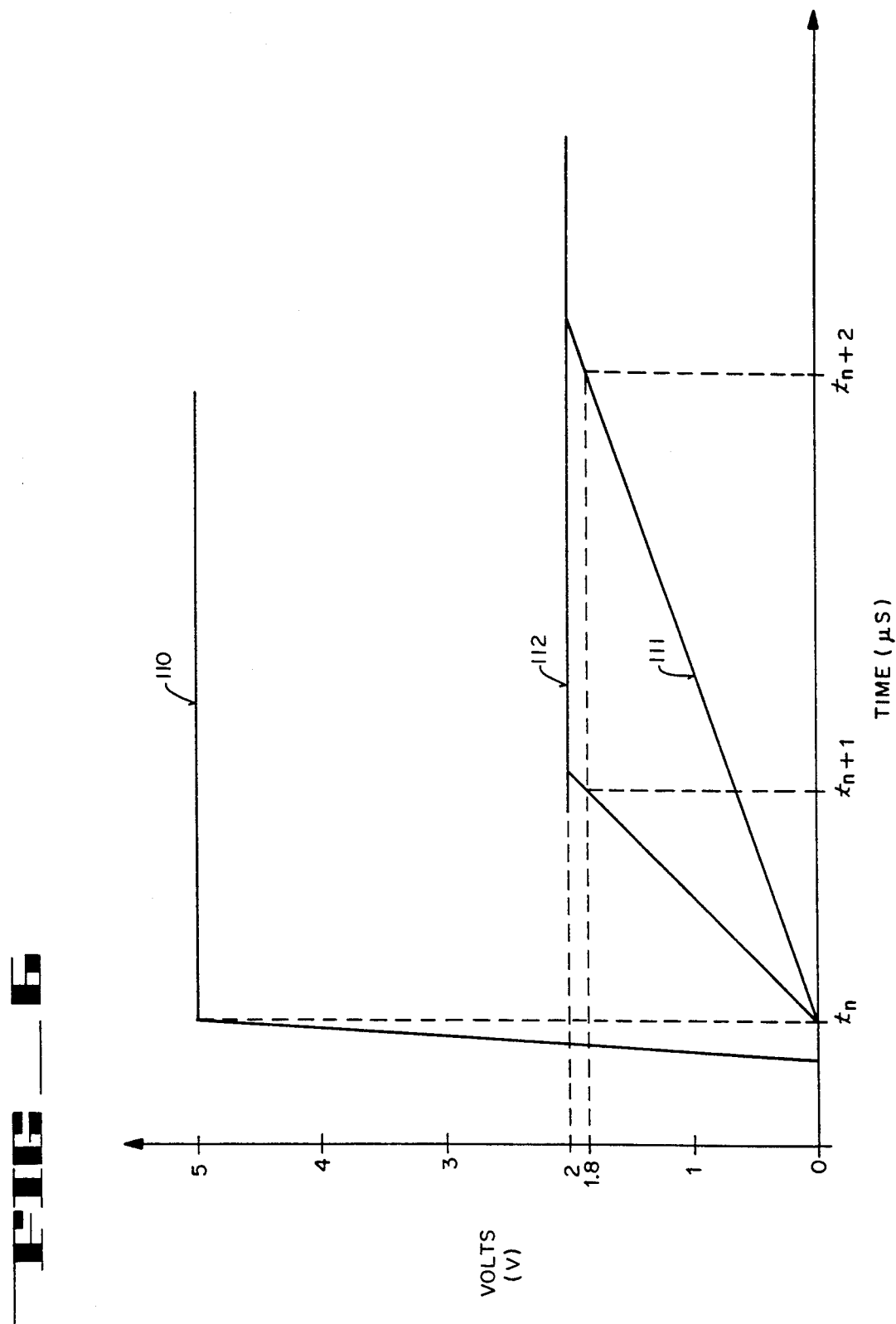
FIG. 6 is a graph comparing recovery times from power down condition of the circuits of FIG. 1 and FIG. 4.

Due to the positive feedback function of transistors 74 and 76 at the power up of bias and control circuit 71, output node 80 is quickly charged to the constant 2 volt UBIAS voltage. In one embodiment, the total recovery time for circuit 71 is approximately less than 50 ns. FIG. 6 illustrates the comparison of the recovery time of circuit 71 with that of the prior art circuit 10 of FIG. 1, which will be described below.

Figure 5:
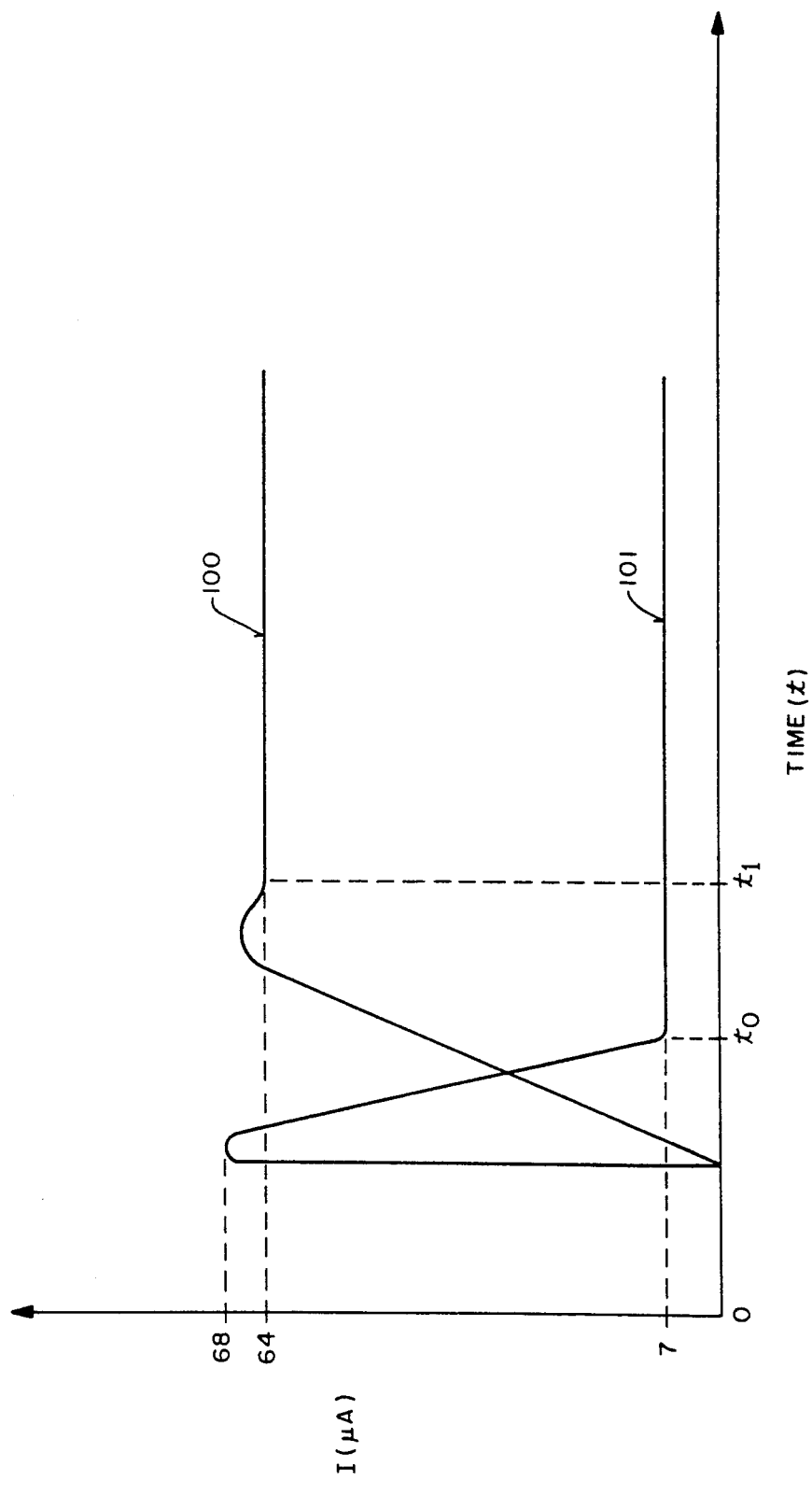
FIG. 5 is a graph comparing current consumptions of the circuits of FIG. 1 and FIG. 4.

When transistors 74 and 76 are turned on to charge output node 80, currents also flow through transistors 75, 77 and 78, respectively. Because transistor 75 is high impedance transistor, it limits the current flow through the circuit branch formed by transistors 72-75, thus reducing power consumption of the circuit. Similarly, because transistors 77 and 78 are high impedance transistors, they also limit the current flow through the circuit branch formed by transistors 76–78, thus reducing the power consumption of the circuit. Using high impedance transistors 75, 77 and 78 to limit the total DC current flow of bias and control circuit 71, the power consumption of the circuit is substantially reduced. In one embodiment, the total current flow of bias and control circuit 71 is 7 μA. FIG. 5 illustrates the comparison of the current consumption of bias and control circuit 71 with that of the prior art bias circuit 10 of FIG. 1, which will be described below.

In an alternative embodiment transistor 75 may be replaced with more than one high impedance transistors connected in the same way in the circuit as transistor 75. In another alternative embodiment, transistor 75 may be replaced with a straight line.

In a further alternative embodiment, transistors 77 and 78 may be replaced with more or fewer than two high impedance transistors such that the voltage level of output node 80 may be adjusted accordingly.

When transistor 75 is replaced with a straight line and transistors 77 and 78 are replaced with one high impedance transistor, the voltage level of output node 80 is set at 1 volt and the power consumption can also be substantially reduced.

The UBIAS voltage provided at output node 80 is relatively well independent of power supply variations, temperature variations and process variations. This is due to the fact that output node 80 is in the circuit branch formed by the same type of N-channel transistors 76–78.

The UBIAS voltage is applied to the gates of transistors 85 and 86. Transistors 85 and 86 are coupled to flash EPROM cell transistors 81 and 82, respectively, of cell CELL1. Controlled by the UBIAS voltage, transistors 85 and 86 each provide a constant drain voltage to transistors 81 and 82, respectively. The gates of transistors 81 and 82 receive a VPU signal. To read CELL1, flash EPROM 30 (FIG. 2) causes the VPU signal to be at Vcc voltage. To program CELL1, the VPU signal becomes the Vpp voltage. To erase CELL1, the VPU signal is at ground voltage.

Figure 1:
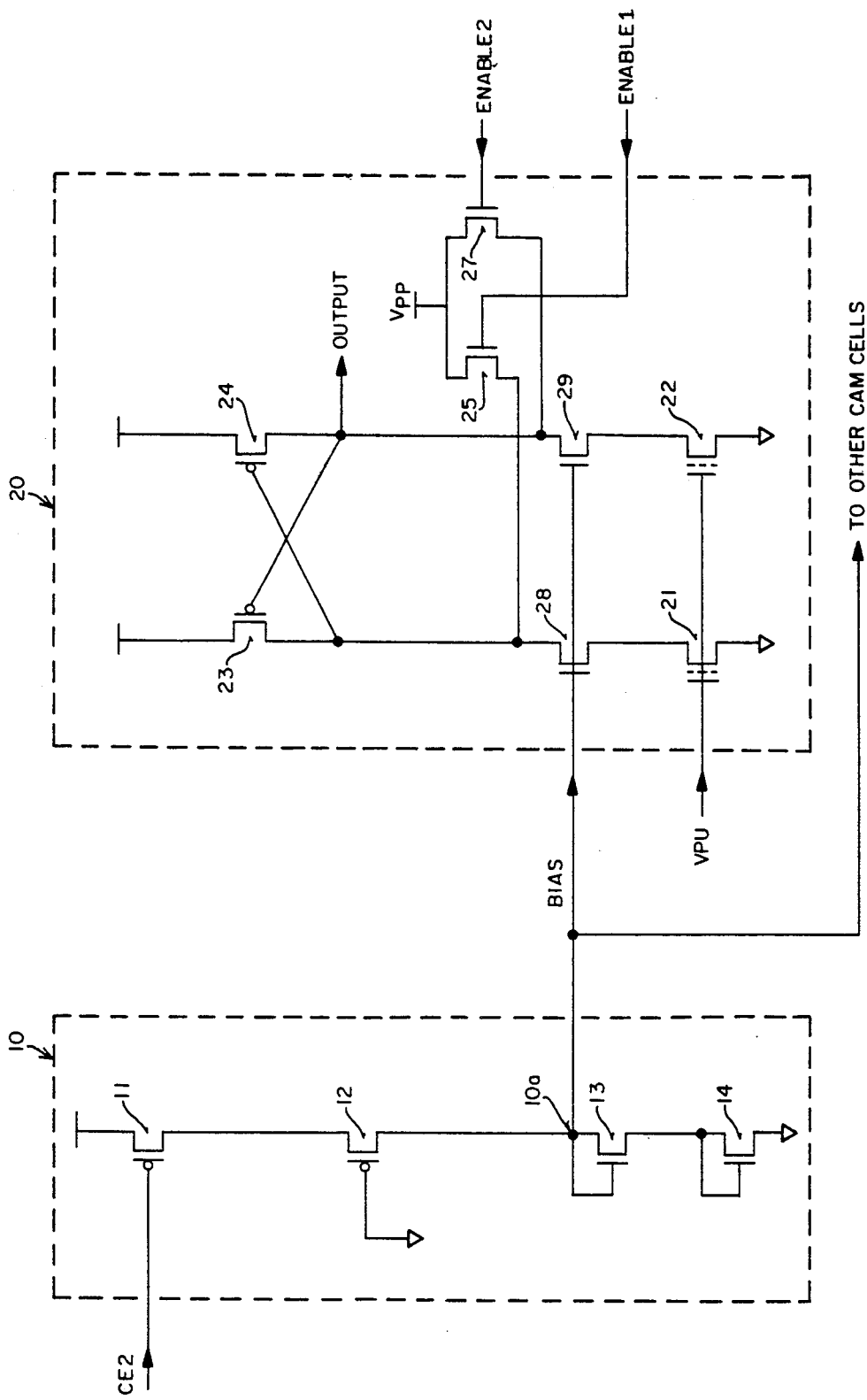
FIG. 1 is a circuit diagram of a prior art CAM bias circuit coupled to a CAM cell.

FIG. 5 illustrates a comparison of the current consumption of the prior art bias circuit 10 of FIG. 1 with that of bias and control circuit 71 of FIG. 4. In FIG. 5, curve 100 represents the total current flow in bias circuit 10 of FIG. 1. Curve 101 represents the total current flow in bias and control circuit 71 of FIG. 4.

As can be seen from FIG. 5, when the CE2 signal switches on bias circuit 10 of FIG. 1 and bias and control circuit 71 of FIG. 4, the total current in bias and control circuit 71 rises to a peak of 68 μA in a very short time period with the total DC current equals to 7 μA (curve 101). Curve 101 then settles at the 7 μA level at time t₀. Bias circuit 10 of FIG. 1, however, registers a much higher current flow of 64 μA at time t₁ (curve 100). As can be seen from FIG. 5, bias and control circuit 71 of FIG. 4 consumes substantially less power than that of bias circuit 10 of FIG. 1. This is due to the presence of high impedance N-channel transistors 76–78.

FIG. 6 illustrates a comparison of the recovery time of the prior art bias circuit 10 of FIG. 1 with that of bias and control circuit 71 of FIG. 4. In FIG. 6, curve 110 represents the $\overline{CE2}$ control signal applied. Curve 111 represents the output BIAS voltage of the prior art bias circuit 10 of FIG. 1. Curve 112 represents the output UBIAS voltage of bias and control circuit 71 of FIG. 4.

As can be seen from FIG. 6, when the $\overline{CE2}$ control signal reaches its high voltage level of 5 volts at time $t_n$ (curve 110), both bias circuit 10 of FIG. 1 and bias and control circuit 71 of FIG. 4 are switched on. The voltage levels at output node 10a in FIG. 1 (curve 111) and at output node 80 of FIG. 4 (curve 112) start to rise. At time $t_{n+1}$, curve 112 reaches a 1.8 volt voltage level which is 90% of the UBIAS voltage level. Curve 112 then stabilizes at the 2 volts UBIAS voltage state shortly thereafter. Curve 111, however, reaches at the 1.8 volt voltage level at time $t_{n+2}$. As shown in FIG. 6, time $t_{n+2}$ is much longer than time $t_{n+1}$. In one embodiment, time $t_{n+2}$ is approximately three times of time $t_{n+1}$. Curve 111 then stabilizes at the 2 volts voltage state which is also the BIAS voltage.

As described above, the fast recovery time of bias and control circuit 71 of FIG. 4 is accomplished by having N-channel transistors 74 and 75 forming a source follower. The source follower provides a positive feedback when bias and control circuit 71 is switched on to charge output node 80 to the UBIAS voltage of 2 volts. In addition, P-channel transistor 72 is positioned between switching transistor 73 and the power supply such that no precharging time to transistor 72 is required when the circuit is switched on by transistor 73. This also helps to reduce the total recovery time. Furthermore, the high impedance of transistors 76–78 which limits the total current flow of the circuit also helps to quickly raise and settle the voltage level of output node 80 to the UBIAS voltage of 2 volts.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory, comprising:
   (A) a memory array;
   (B) a configuration cell for configuring the memory with respect to memory device operation, wherein the configuration cell is coupled to various internal circuits of the memory;
   (C) bias circuit means coupled to the configuration cell for providing a drain voltage to the configuration cell, wherein the bias circuit means comprises
      (1) source follower means coupled to a power supply and an output node for charging and settling the output node to a predetermined voltage level when the circuit is powered on, wherein the source follower means acts as a positive feedback loop to quickly charge and settle the output node to the predetermined voltage level, wherein the output node provides the drain voltage to the configuration cell, wherein the source follower means has a first source line and a second source line, wherein the second first line is coupled to the output node, wherein the second source line is coupled to ground;
      (2) first high impedance voltage divider means coupled to the first source line and the ground for setting the voltage level of the output node at the predetermined voltage level and for limiting current flow from the first source line toward the ground such that power consumption of the bias circuit is substantially reduced.

2. The nonvolatile memory of claim 1, wherein the bias circuit further comprises:
 (i) control device means coupled between the power supply and the source follower means for controlling on and off the bias circuit, wherein the control device means receives a control signal which controls the control device means to turn on and off of the bias circuit; and
 (ii) high impedance transistor means coupled between the power supply and the control device means for lowering the voltage level of the power supply to the bias circuit, wherein the high impedance transistor means is constantly charged by the power supply, wherein when the control device means turns on the bias circuit, no precharging time is required at the high impedance transistor means.

3. The nonvolatile memory of claim 2, wherein the high impedance transistor means comprises a P-channel transistor.

4. The nonvolatile memory of claim 1, wherein the source follower means further comprises a first N-channel transistor and a second N-channel transistor, wherein the first and the second N-channel transistors form the positive feedback loop.

5. The nonvolatile memory of claim 4, wherein the first and the second N-channel transistors each has a drain coupled to the power supply, wherein the first N-channel transistor has a source coupled to the first source line, and a gate coupled to the second source line, wherein the second N-channel transistor has a source coupled to the second source line, and a gate coupled to the drain of the first N-channel transistor.

6. The nonvolatile memory of claim 5, wherein the bias circuit further comprises a P-channel transistor coupled between the power supply and the drain of the first N-channel transistor for lowering the voltage level of the power supply to the bias circuit.

7. The nonvolatile memory of claim 1, wherein the first high impedance voltage divider means comprises a high impedance N-channel transistor.

8. The nonvolatile memory of claim 1, wherein the bias circuit further comprises a second high impedance voltage divider means coupled between the second source line and the ground, wherein the second high impedance voltage divider means also limits current flow of the bias circuit towards the ground.

9. The nonvolatile memory of claim 8, wherein the first high impedance voltage divider includes a first high impedance N-channel transistor and a second high impedance N-channel transistor, wherein the second high impedance voltage divider includes a third high impedance N-channel transistor.

10. The nonvolatile memory of claim 1, wherein the drain voltage at the output node is independent of a power supply variation, a temperature variation and a process skew.

11. The nonvolatile memory of claim 1, wherein the predetermined voltage level is approximately 2 volts.

12. A circuit for providing a drain voltage for a configuration cell of a nonvolatile memory comprising:
 (A) source follower means coupled to a power supply and to an output node for charging and settling the output node to a predetermined voltage level when the circuit is powered on, wherein the source follower means acts as a positive feedback loop to quickly charge and settle the output node to the predetermined voltage level, wherein the output node provides the drain voltage, wherein the source follower means includes a first source line coupled to the output node and a second source line coupled to ground:
 (B) high impedance voltage divider means coupled to the output node and the ground for setting the voltage level of the output node at the predetermined voltage level and for limiting current flow of the circuit towards the ground such that power consumption of the circuit is substantially reduced.

13. The circuit of claim 12, further comprising a high impedance transistor means and a control device means coupled between the power supply and the source follower means, wherein the high impedance transistor means is coupled to the power supply, wherein the control device means is coupled to the transistor means and to the source follower means, wherein the transistors means lowers the voltage level of the power supply to the source follower means, wherein the transistor means is constantly charged by the power supply, wherein the control device means receives a control signal to turn on and off the circuit, wherein when the control circuit turns on the circuit, no precharging time is required at the transistor means.

14. The circuit of claim 12, further comprising a second high impedance voltage divider means coupled between the second source line of the source follower means and the ground for limiting current flow of the circuit towards the ground.

15. A circuit for providing a drain voltage for a configuration memory cell of a nonvolatile memory, comprising:
 (A) high impedance transistor means coupled to a power supply for lowering the voltage level of the power supply to the circuit, wherein the high impedance transistor means is constantly charged by the power supply;
 (B) control device means coupled to the high impedance transistor means for controlling on and off of the circuit, wherein the control device means receives a control signal which controls the control device means to turn on and off the circuit, wherein when the control device means turns on the circuit, no precharging time is required at the high impedance transistor means;
 (C) source follower means having a first end coupled to the control device means, a second end coupled to the power supply, a third end, and a fourth end coupled to an output node, for charging and settling the output node to a predetermined voltage level when the circuit is powered on by the control device means, wherein the source follower means acts as a positive feedback loop to quickly charge and settle the output node to the predetermined voltage level, wherein the output node provides the drain voltage;
 (D) first high impedance voltage divider means coupled to the third end and a ground for limiting current flow from the third end toward the ground;
 (E) second high impedance voltage divider means coupled to the fourth end and the ground for setting the voltage level of the output node at the predetermined voltage level and for limiting current flow from the fourth end toward the ground such that power consumption of the circuit is substantially reduced.

16. The circuit of claim 15, wherein the high impedance transistor means comprises a P-channel transistor.

17. The circuit of claim 15, wherein the drain voltage at the output node is independent of a power supply variation, a temperature variation and a process skew.

18. The circuit of claim 15, wherein the predetermined voltage level is approximately 2 volts.

19. The circuit of claim 15, wherein the first high impedance voltage divider means comprises a first high impedance N-channel transistor, wherein the second high impedance voltage divider means comprises a second high impedance N-channel transistor and a third high impedance N-channel transistor.

20. The circuit of claim 15, wherein the source follower means further comprises a first N-channel transistor and a second N-channel transistor, wherein the first and the second N-channel transistors form the positive feedback loop.

21. The circuit of claim 20, wherein the first N-channel transistor has a drain coupled to the first end, a source coupled to the third end and a gate coupled to the fourth end, wherein the second N-channel transistor has a drain coupled to the second end, a source coupled to the fourth end, and a gate coupled to the first end.

22. A circuit for providing drain voltage to a configuration cell of a non-volatile memory, comprising:
   (a) a first high impedance P-channel transistor having a source coupled to a power supply, and a gate coupled to a ground, wherein the first P-channel transistor functions as a voltage divider and to reduce power supply noise to the circuit;
   (b) a second P-channel transistor having a source coupled to a drain of the first P-channel transistor, and a gate coupled to a control signal, wherein the control signal controls on and off of the second P-channel transistor which in turn controls on and off of the circuit;
   (c) a first N-channel transistor having a drain coupled to a drain of the second P-channel transistor, and a gate coupled to an output node of the circuit;
   (d) first high impedance voltage divider means having a second N-channel transistor that has a drain and a gate coupled to a source of the first N-channel transistor, and a source coupled to the ground, wherein the second N-channel transistor has a high impedance;
   (e) a third N-channel transistor having a drain coupled to the power supply, a gate coupled to the drain of the second P-channel transistor, and a source coupled to the output node, wherein the first N-channel transistor and the third N-channel transistor form a positive feedback loop for charging and settling the output node to a predetermined voltage level, wherein the output node provides the drain voltage;
   (f) second high impedance voltage divider means coupled between the output node and the ground, wherein the second high impedance voltage divider means includes a fourth N-channel transistor and a fifth N-channel transistor, wherein the fourth N-channel transistor has a drain and a gate coupled to the output node, wherein the fifth N-channel transistor has a drain and a gate coupled to a source of the fourth N-channel transistor, and a source coupled to the ground, wherein the first P-channel transistor is constantly charged by the power supply such that no precharging time is needed for the circuit when the control signal causes the second P-channel transistor to conduct, wherein when the control signal causes the second P-channel transistor to conduct, the positive feedback loop quickly charges and settles the output node to the predetermined voltage level, wherein the second voltage divider means sets the voltage level of the output node at the predetermined voltage level, wherein the first and the second high impedance voltage divider means limit current flow of the circuit to the ground such that power consumption of the circuit is substantially reduced.

23. The circuit of claim 22, wherein the drain voltage is independent of a power supply variation, a temperature variation and a process skew.

24. The circuit of claim 22, wherein the predetermined voltage level is approximately 2 volts.

* * * * *